United States Patent
Herzka et al.

(10) Patent No.: US 7,514,927 B2
(45) Date of Patent: Apr. 7, 2009

(54) MR MULTI-SLICE STEADY STATE FREE PRECESSION IMAGING

(75) Inventors: Daniel Herzka, Rockville, MD (US); Richard Winkelmann, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 11/815,216

(22) PCT Filed: Feb. 1, 2006

(86) PCT No.: PCT/IB2006/050347

§ 371 (c)(1), (2), (4) Date: Aug. 1, 2007

(87) PCT Pub. No.: WO2006/082564

PCT Pub. Date: Aug. 10, 2006

(65) Prior Publication Data

US 2008/0169810 A1    Jul. 17, 2008

Related U.S. Application Data

(60) Provisional application No. 60/649,649, filed on Feb. 3, 2005.

(51) Int. Cl.
*G01V 3/00* (2006.01)
(52) U.S. Cl. .................... 324/318; 324/309
(58) Field of Classification Search ......... 324/300–322; 600/407–445
See application file for complete search history.

(56) References Cited

U.S. PATENT DOCUMENTS

| | | | |
|---|---|---|---|
| 4,847,560 A | | 7/1989 | Sattin |
| 5,327,088 A | * | 7/1994 | Pipe ........................... 324/309 |
| 5,578,924 A | | 11/1996 | Dumoulin et al. |
| 5,749,834 A | | 5/1998 | Hushek |
| 6,541,971 B1 | * | 4/2003 | Dannels ...................... 324/309 |
| 6,714,807 B2 | * | 3/2004 | Zur ............................. 600/410 |
| 6,885,193 B2 | * | 4/2005 | Foxall ......................... 324/309 |
| 6,906,516 B2 | * | 6/2005 | Bangerter et al. ........... 324/309 |
| 7,132,828 B2 | * | 11/2006 | Lustig et al. ................ 324/309 |
| 7,205,763 B2 | * | 4/2007 | Porter ......................... 324/306 |

(Continued)

FOREIGN PATENT DOCUMENTS

EP    0322968 A1    7/1989

(Continued)

OTHER PUBLICATIONS

Breuer, F., et al.; Controlled Aliasing in Parallel Imaging (CAIPI) for Multi-slice Imaging; 2003; Proc. Int'l. Soc. Mag. Reson. Med.; 11:18.

(Continued)

*Primary Examiner*—Brij B Shrivastav (57) ABSTRACT

In a coherent magnetic resonance imaging method, a plurality of slices (70, 72; 170, 172) are each prepared (74, 76) in a steady spin state. Time domain multiplexed readouts (80, 82) are performed. Each readout acquires magnetic resonance data corresponding to one of the steady spin state slices. Radio frequency excitation pulses (120, 122) are interleaved with the time domain multiplexed readout pulses (102, 112) to maintain the steady spin states of the slices. The acquired magnetic resonance data are reconstructed (62) to produce reconstructed images corresponding to the plurality of slices.

20 Claims, 6 Drawing Sheets

U.S. PATENT DOCUMENTS 7,292,039 B1 * 11/2007 Laub et al. .................. 324/318
2004/0095138 A1 5/2004 Foxall

FOREIGN PATENT DOCUMENTS

EP 0997743 A2 5/2000
EP 1014102 A2 6/2000

OTHER PUBLICATIONS

Herzka, D. A., et al.; Bi-plane Imaging with SSFP; 2005; Proc. Int'l. Soc. Mag. Reson. Med.; 13:2381.
Herzka, D. A., et al.; Improved SNR in Breath-Hold Cardiac Cine Imaging by Slice Interleaving; 2000; Proc. Int'l. Soc. Mag. Reson. Med.; 8:1529.
Nayak, K. S., et al.; Rapid Ventricular Assessment Using Real-Time Interactive Multislice MRI; 2001; MRM; 45:371-375.
Quick, H. H., et al.; Interventional MRA using actively visualized catheters, TrueFISP, and Real-Time Image Fusion; 2003; MRM; 49:129-137.
Slavin, G. S., et al.; Steady-State Preparation for Improved Efficiency in Breath-Held Multi-Slice 2D FIESTA Imaging of the Heart; 2003; Proc. Int'l. Soc. Mag. Reson. Med.; 11:979.

* cited by examiner

MR MULTI-SLICE STEADY STATE FREE PRECESSION IMAGING

CROSS REFERENCE TO RELATED APPLICATIONS

This application claims the benefit of U.S. provisional application Ser. No. 60/649,649 filed Feb. 3, 2005, which is incorporated herein by reference.

The following relates to the magnetic resonance arts. It finds particular application in multi-slice magnetic resonance imaging, and will be described with particular reference thereto. More generally, it finds application in conjunction with substantially any type of coherent magnetic resonance imaging techniques, such as steady-state free precession (SSFP), fast imaging with steady precession (TrueFISP), balanced fast field echo (bFFE), completely balanced steady state (CBASS), and so forth.

Multi-slice magnetic resonance imaging is commonly performed using incoherent imaging techniques in which the excited magnetic resonance decays (or is spoiled) substantially completely between readout repeat time (TR) intervals. Because the excitation is not maintained across TR intervals, the pulse sequence can excite slices at substantially any orientation, relationship to each other, and in substantially any order. Typically, one slice is acquired completely before continuing to the next.

In coherent magnetic resonance imaging, the magnetic spins are placed into a steady state condition through the use of a preparatory pulse or pulse sequence. After the preparation, imaging is performed with the steady spin state maintained across TR intervals by application of occasional radio frequency pulses spatially limited by suitable magnetic field gradients. Advantageously, since the spin state does not decay between TR intervals, a higher signal level can be obtained relative to incoherent imaging due to the use of higher excitation flip angles.

However, the need to maintain steady state across TRs intervals has heretofore substantially limited the extension of coherent imaging to multiple slices. When attempting coherent imaging of a subsequent slice interleaved or time multiplexed with the first, magnetic resonance in the previous, slice which remains in steady state, interferes with imaging of the subsequent slice. The reconstructed image of the subsequent slice typically contains artifact features due to reconstructed magnetic resonance signals from the previous slice. Furthermore, common approaches which acquire images in a sequential manner require preparatory pulses and interruptions to the imaging steady state, again interfering with imaging further imaging of the same slice and losing efficiency due to the preparatory pulses.

In some approaches, multi-slice imaging is enabled by following the TR interval with a spoiler sequence which destroys the spin resonance state. However, by spoiling the magnetic resonance between TR intervals, the increased signal advantage of coherent imaging is lost. Moreover, in these approaches the preparatory sequence should also be repeated for each acquisition of each slice, which slows imaging.

The following contemplates improved apparatuses and methods that overcome the aforementioned limitations and others.

According to one aspect, a magnetic resonance imaging method is provided which includes: performing time domain multiplexed readouts, each readout acquiring magnetic resonance data corresponding to one of the steady spin state slices; interleaving radio frequency excitation pulses with the time domain multiplexed readouts to maintain the steady spin states of the slices; and reconstructing the acquired magnetic resonance data to produce reconstructed images corresponding to the plurality of slices.

According to another aspect, a magnetic resonance imaging system is disclosed, which performs a method including: performing time domain multiplexed readouts, each readout acquiring magnetic resonance data corresponding to one of the steady spin state slices; interleaving radio frequency excitation pulses with the time domain multiplexed readouts to maintain the steady spin states of the slices; and reconstructing the acquired magnetic resonance data to produce reconstructed images corresponding to the plurality of slices.

One advantage resides in facilitating multiple-slice coherent imaging.

Another advantage resides in facilitating multiple-slice coherent imaging without limitations in slice orientations, slice thicknesses or slice field-of-view.

Another advantage resides in removing interruptions to steady state in multiple-slice coherent imaging.

Another advantage resides in improved temporal registration in dynamic multi-slice coherent imaging.

Another advantage resides in providing visible registration markers indicative of intersections of slices of a multi-slice image.

Numerous additional advantages and benefits will become apparent to those of ordinary skill in the art upon reading the following detailed description.

The invention may take form in various components and arrangements of components, and in various process operations and arrangements of process operations. The drawings are only for the purpose of illustrating preferred embodiments and are not to be construed as limiting the invention.

Figure 1:
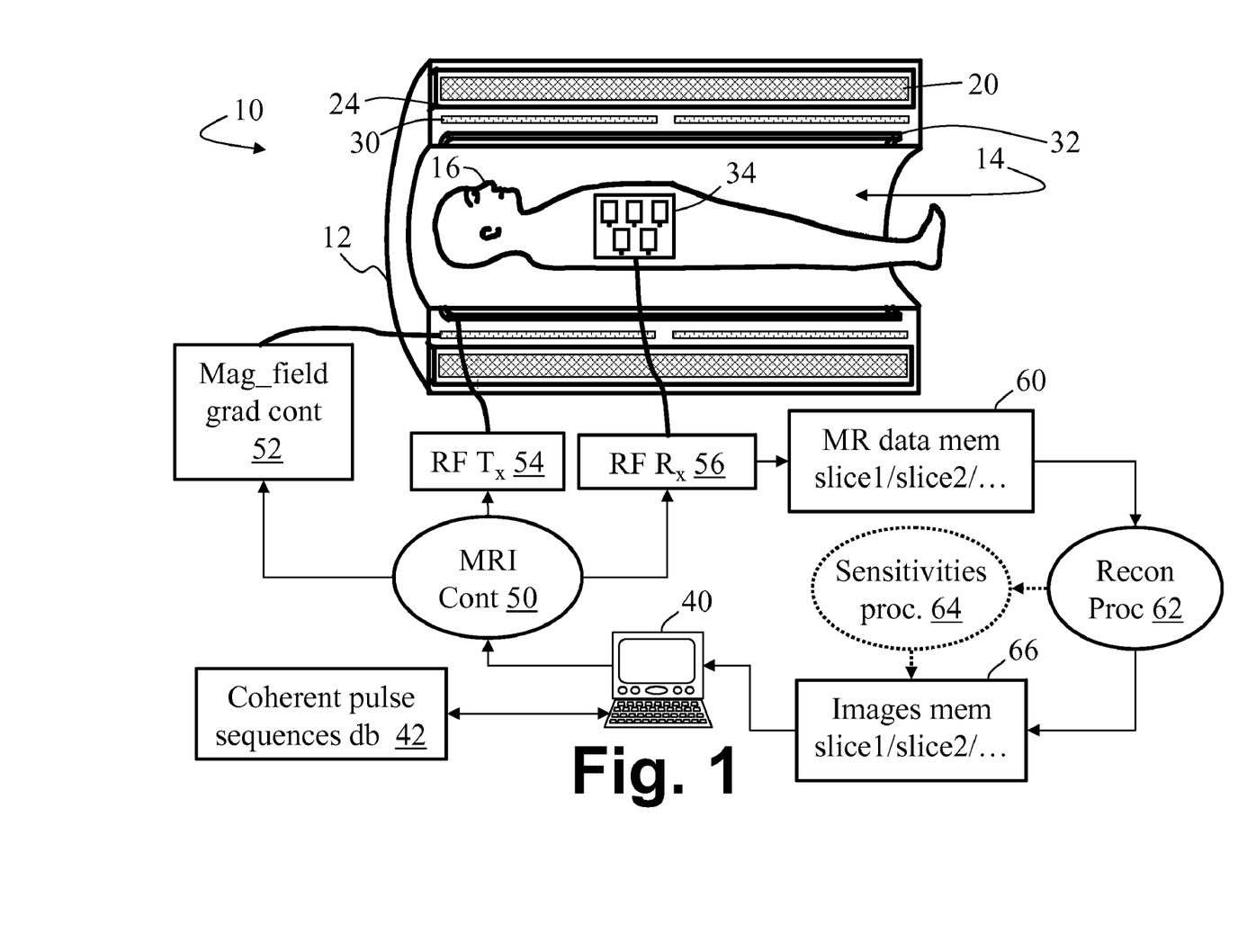
FIG. 1 diagrammatically shows a magnetic resonance imaging system for performing coherent multi-slice imaging.

With reference to FIG. 1, a magnetic resonance imaging scanner 10 includes a housing 12 defining an examination region 14 in which is disposed a patient or other imaging subject 16. A main magnet 20 disposed in the housing 12 generates a main magnetic field in the examination region 14. Typically, the main magnet 20 is a superconducting magnet surrounded by cryoshrouding 24; however, a resistive main magnet can also be used. Magnetic field gradient coils 30 are arranged in or on the housing 12 to superimpose selected magnetic field gradients on the main magnetic field within the examination region 14. Typically, the magnetic field gradient coils include coils for producing three orthogonal magnetic field gradients, such as x-gradients, y-gradients, and z-gradients. One or more radio frequency coils, such as a whole-body radio frequency coil 32, or a coils array 34, are arranged in or on the housing 12 to inject radio frequency excitation pulses into the examination region 14.

A user interface 40 is used by a technician, radiologist, or other user to select a coherent magnetic resonance imaging pulse sequence such as a SSFP sequence, a TrueFISP sequence, a bFFE sequence, a CBASS sequence, or so forth from a coherent pulse sequences database 42. The user also selects multiple slices at different positions and/or orientations to image. A computational processor of the user interface 40 configures excitation frequencies, x-, y-, and z-gradients, or other parameters of the selected coherent pulse sequence for imaging each selected slice. Alternatively, the selected stored pulse sequence may be pre-configured to acquire a plurality of different slice positions and/or orientations.

The selected coherent magnetic resonance imaging pulse sequence is executed by a magnetic resonance imaging controller 50 that operates: magnetic field gradient controllers 52 coupled to the gradient coils 30; a radio frequency transmitter 54 coupled to the whole body coil 32 as illustrated, or coupled to the coils array 34; and a radio frequency receiver 56 connected with the coils array 34 as illustrated, or connected to the whole body coil 32. The magnetic resonance signals received by the radio frequency receiver 56 are stored in a magnetic resonance data memory 60 with the data segregated by slice.

A reconstruction processor 62 reconstructs the stored magnetic resonance data for each slice into a reconstructed image of that slice using a Fourier transform reconstruction technique or other suitable reconstruction technique. In some embodiments, a sensitivities processor 64 separates out image data by slice based on coil sensitivities of the coils of the coils array 34. This processing is analogous to the unfolding of the reconstructed image performed by SENSE processing, except that the sensitivities processor 64 "unfolds" with respect to the slice-select gradient. The optional nature of the sensitivities processing is indicated in FIG. 1 by showing the sensitivities processor 64 and connecting lines in phantom.

The reconstructed and optionally unfolded image of each slice is stored in an images memory 66. An image of one or more slices can be displayed on the user interface 40, transmitted over a local area network or the Internet, printed by a printer, or otherwise utilized. In some embodiments, a separate user interface with high resolution monitor is provided for displaying or otherwise manipulating the images.

The magnetic resonance imaging system of FIG. 1 is an expository example. In general, substantially any magnetic resonance imaging scanner can incorporate the disclosed multi-slice coherent imaging techniques disclosed herein. For example, the scanner can be an open magnet scanner, a vertical bore scanner, a low-field scanner, a high-field scanner, or so forth. Moreover, although shown as separate components in FIG. 1 for expository purposes, it will be appreciated that various components such as the user interface 40, database 42, controller 50, and so forth may be integrated with one another or otherwise arranged. For example, the user interface 40 may be a computer with a hard drive storing the coherent pulse sequences database 42, so that the database 42 is integrated with the user interface 40.

Figure 2:
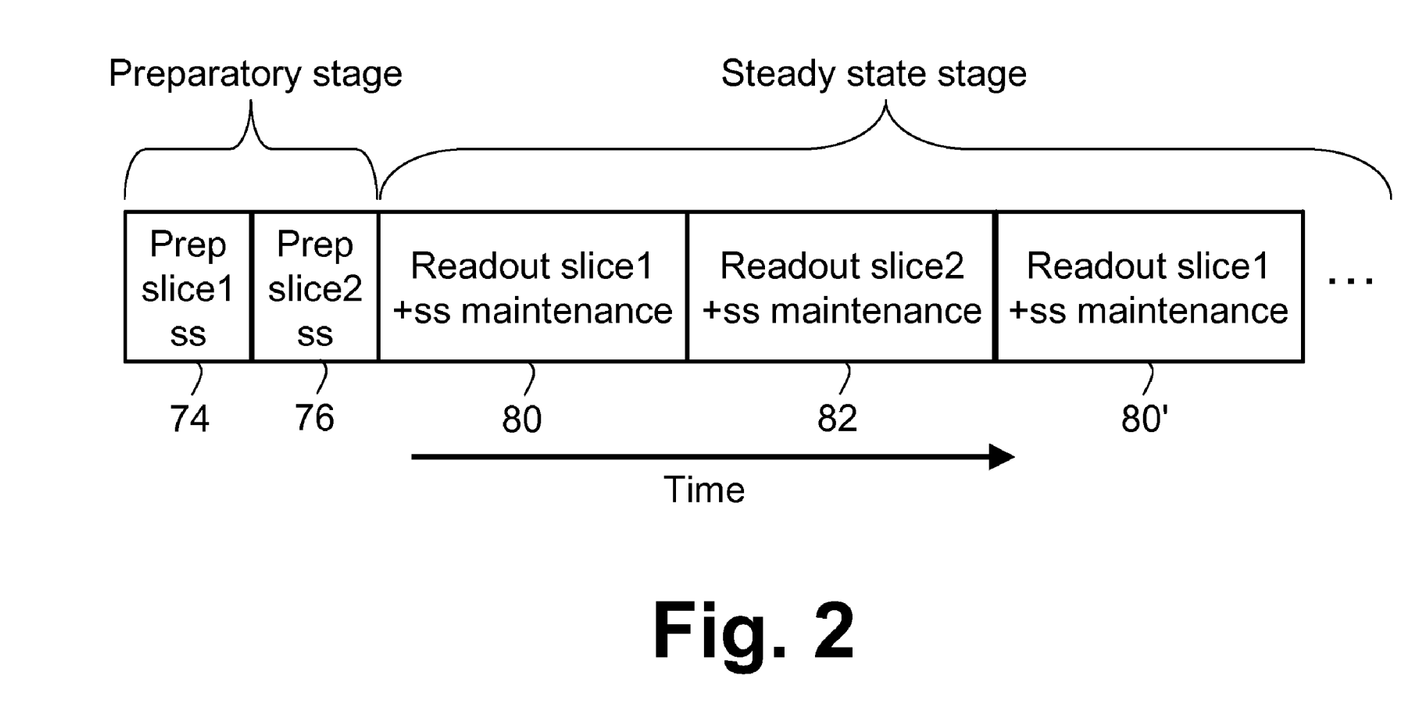
FIG. 2 diagrammatically shows a time flow of a coherent multi-slice imaging sequence.

With reference to FIG. 2, the selected coherent sequence has the following general format. During a preparatory stage, all the slices to be imaged are prepared in a suitable steady spin state. For SSFP imaging, the steady state of each slice can be prepared using an $\alpha/2$ radio frequency pulse in conjunction with a suitable slice selective magnetic field gradient. In other embodiments, more complex preparatory pulse sequences are employed to prepare each slice in a steady spin state; for example, some preparatory sequences suitable for use in CBASS imaging are disclosed in Foxall, U.S. Published Application No. 2004/0095138 A1. Moreover, the preparatory sequence can be omitted if the substantial artifacts from the transition to magnetic resonance steady state are ignored during the first of multiple images in a dynamic acquisition. More generally, substantially any preparatory pulse sequence that places or attempts to place a slice into a steady spin state for coherent imaging can be employed in the preparatory stage.

Figure 3A:
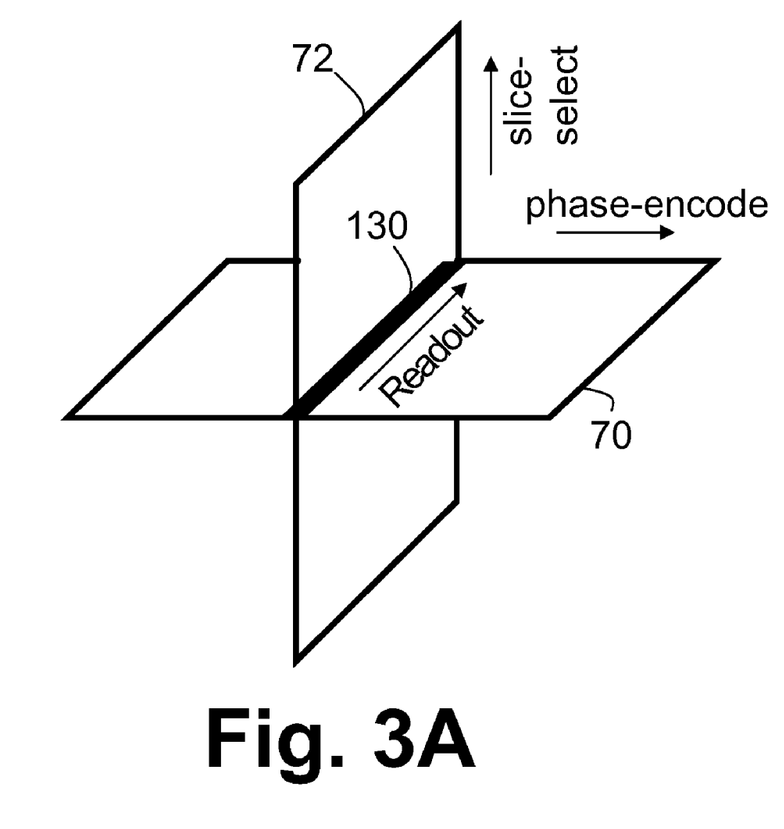
FIGS. 3A and 3B show perspective and side views, respectively, of two orthogonal slices imaged using coherent multi-slice imaging.
Figure 3B:
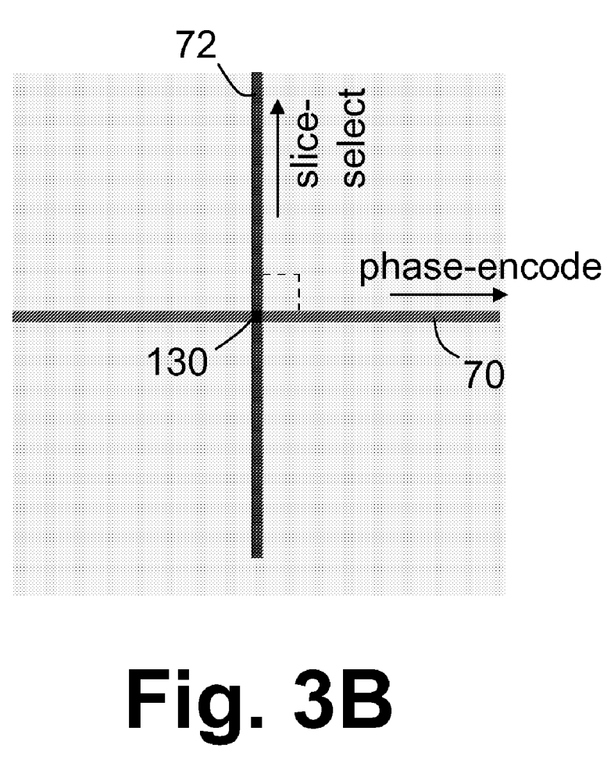

With continuing reference to FIG. 2 and with further reference to FIGS. 3A and 3B, in one embodiment two slices 70, 72 which are orthogonal to each other are imaged. The preparatory stage (FIG. 2) includes a first preparatory sequence 74 that prepares the steady spin state of the first slice 70, and a second preparatory sequence 76 that prepares the steady spin state of the second slice 72.

In FIGS. 3A and 3B three orthogonal magnetic field gradient directions are labeled: "slice-select", "phase-encode", and "readout". For the first slice 70, a magnetic field gradient in the "slice-select" direction is used concurrently with magnetic resonance excitation to excite a steady spin state in the first slice 70. For the second slice 72, a magnetic field gradient in the "phase-encode" direction is used concurrently with magnetic resonance excitation to excite a steady spin state in the orthogonal second slice 72.

Figure 4:
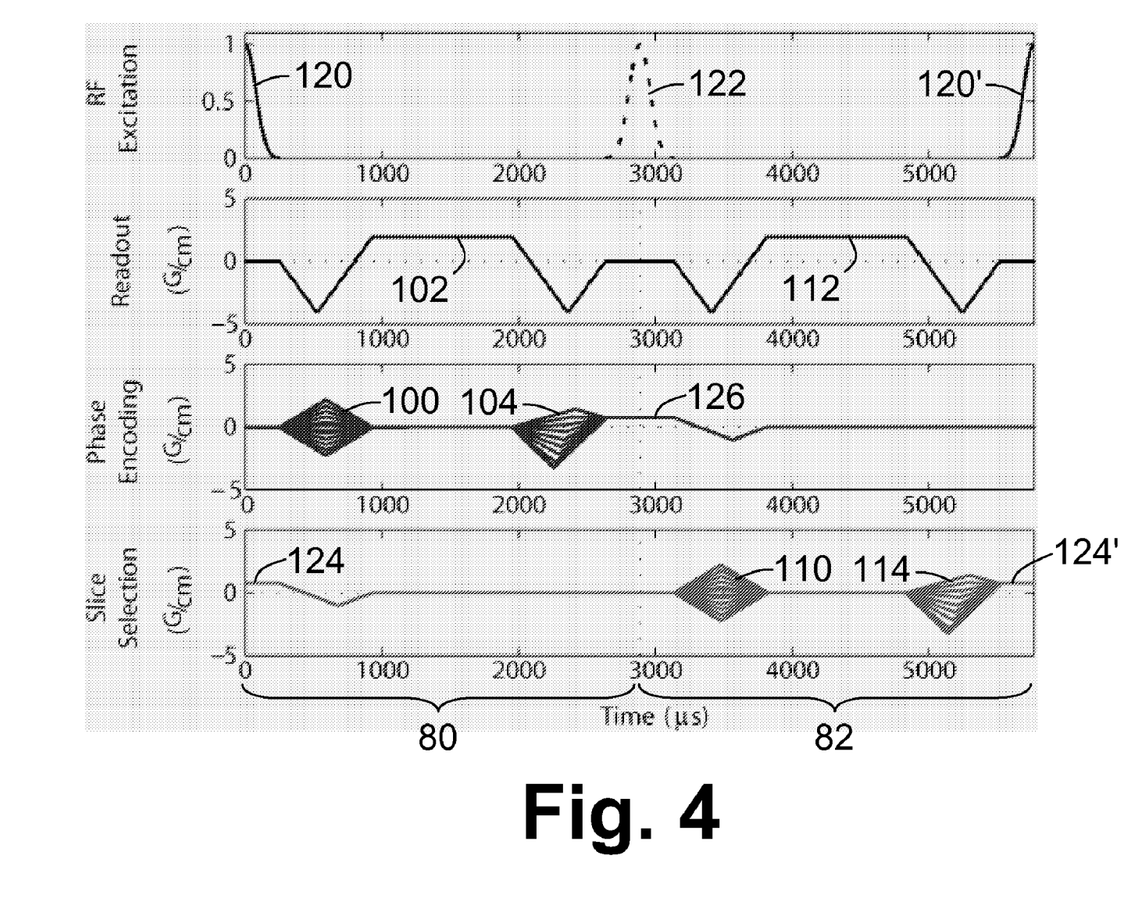
FIG. 4 shows a suitable magnetic resonance imaging pulse sequence for imaging the orthogonal slices of FIGS. 3A and 3B.

With continuing reference to FIGS. 2, 3A, and 3B, and with further reference to FIG. 4, during a steady state stage the slices 70, 72 are read out. Specifically, during a first readout 80 the slice 70 is read out, while during a second readout 82 the slice 72 is read out. FIG. 4 shows the readout pulse sequence. During the first readout 80 one or more magnetic field gradients 100 are applied in the "phase-encode" direction to encode the phase of spins of the first slice 70, after which a magnetic field gradient 102 in the "readout" direction is applied to frequency-encode spins of the first slice 70 during readout. Thus, the first slice 70 is phase-encoded in the "phase-encode" direction and frequency-encoded in the "readout" direction. After the frequency encoding is removed, another one or more magnetic field gradients 104 are applied in the "phase-encode" direction to remove the phase encoding of the first slice 70.

During the second readout 82 one or more magnetic field gradients 110 are applied in the "slice-select" direction to encode the phase of spins of the second slice 72, after which a magnetic field gradient 112 in the "readout" direction is applied to frequency-encode spins of the second slice 72 during readout. Thus, the second slice 72 is phase-encoded in the "slice-select" direction and frequency-encoded in the "readout" direction. After the frequency encoding is removed, another one or more magnetic field gradients 114 are applied in the "slice-select" direction to remove the phase encoding of the second slice 72.

The readouts 80, 82 are time-multiplexed during the steady state stage. Moreover, as further shown in FIG. 4 during the time steady state stage radio frequency excitation pulses 120, 122 are interleaved with the time-domain with the readouts 80, 82 so as to maintain the steady spin states of the slices 70, 72. Specifically, the first radio frequency excitation pulse 120 is applied in conjunction with a magnetic field gradient 124 in the "slice-select" direction to maintain the steady spin state of the first slice 70, while the second radio frequency excitation pulse 122 is applied in conjunction with a magnetic field gradient 126 in the "phase-encode" direction to maintain the steady spin state of the first slice 72. Because the radio frequency pulses 120, 122 and associated magnetic field gradients 124, 126 maintain the steady spin states of the slices 70, 72, additional readouts can be performed—for example, a next readout 80' of the first slice 70 is illustrated in FIG. 2, and a rising edge of a next radio frequency excitation 120' and corresponding magnetic field gradient 124' in the "slice-select" direction is indicated in FIG. 4. Thus, the time-domain multiplexed readouts and interleaved radio frequency excitation pulses, and the reconstructing of the resultant imaging data, can be performed continuously without repeating the preparatory stage to produce a plurality of time-separated reconstructed images An intersection stripe region 130 (see FIGS. 3A and 3B) where the two slices 70, 72 intersect is selected by both excited by both magnetic field gradients 124, 126 and hence is excited by both radio frequency pulses 120, 122. The double excitation can lead to a saturated signal intensity in the intersection stripe region 130, producing a corresponding line in the reconstructed images of the slices 70, 72. If appropriately chosen, the imaging flip angles for each slice could be different and still lead to the same signal, assuming a certain type of tissue with characteristic T1 and T2 relaxation constants. The relationship between signal intensity and imaging flip angle is such that it increases to a maximum and then decreases slowly. If two angle are chosen appropriately, they could yield the same signal intensity, removing intersection stripe, if desired.

Because both slices 70, 72 remain excited in steady spin states during the readouts 80, 82, cross-slice interference can be expected. The interference of the second slice 72 on the image of the first slice 70 occurs over the projection along the "phase-encode" direction of the second slice 72 onto the first slice 70. For orthogonal slices 70, 72, this interference projection has the same width as the saturated intersection stripe region 130. Accordingly, the image of the saturated intersection stripe region 130 in the images of the slices 70, 72 advantageously identifies the intersection of the two slices 70, 72 and the region of cross-slice interference for orthogonal slices. The width of the intersection stripe 130 visible in each image depends on both the slice thickness, which is typically around 5 to 10 mm for typical perpendicular slices.

FIGS. 2, 3A, 3B, and 4 particularly describe imaging of two orthogonal slices. The imaging of the first slice 70 employs the gradients in the "slice-select" and "phase-encode" directions in their usual manner. The imaging of the second slice 72 swaps magnetic field gradients in the "slice-select" and "phase-encode" directions so that selection of the second slice 72 uses magnetic field gradients in the "phase-encode" direction while the phase-encoding of the spins of the second slice 72 employs magnetic field gradients in the "slice-select" direction. The slices 70, 72 both frequency encode using magnetic field gradients in the same "readout" direction.

In some embodiments, imaging of a third slice (not illustrated) orthogonal to the slices 70, 72 is accomplished by making a further swap of magnetic field gradient directions. The imaging of the third slice employs magnetic field gradients in the "readout" direction to perform slice selection. Magnetic field gradients in the "phase-encode" direction can be used to phase-encode the third slice while magnetic field gradients in the "slice-select" direction can be used to frequency-encode the third slice. Alternatively, magnetic field gradients in the "slice-select" direction can be used to phase-encode the third slice while magnetic field gradients in the "phase-encode" direction can be used to frequency-encode the third slice.

Figure 5A:
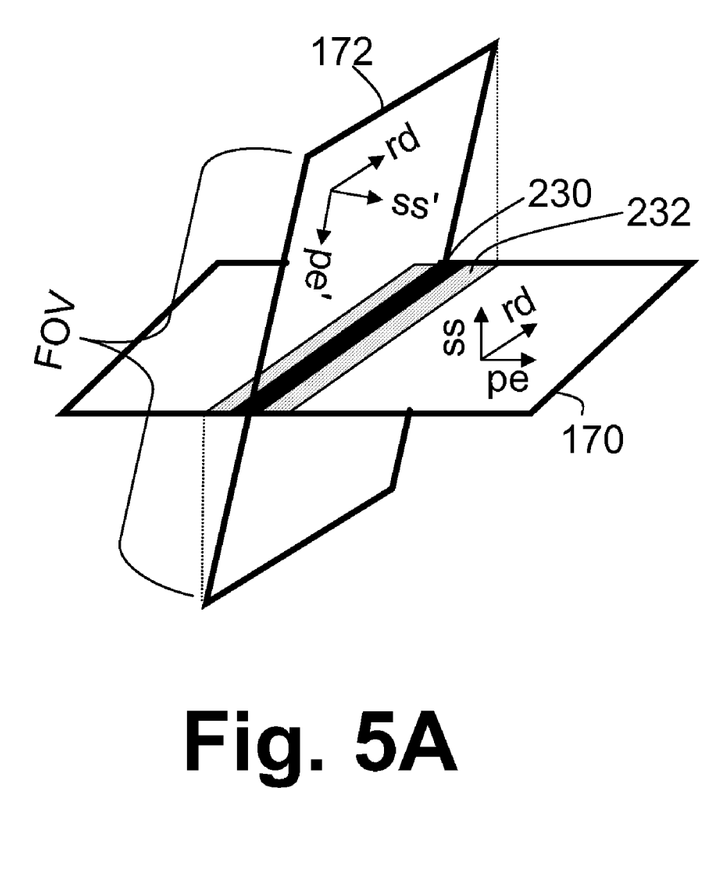
FIGS. 5A and 5B show perspective and side views, respectively, of two non-orthogonal and non-parallel slices imaged using coherent multi-slice imaging.
Figure 5B:
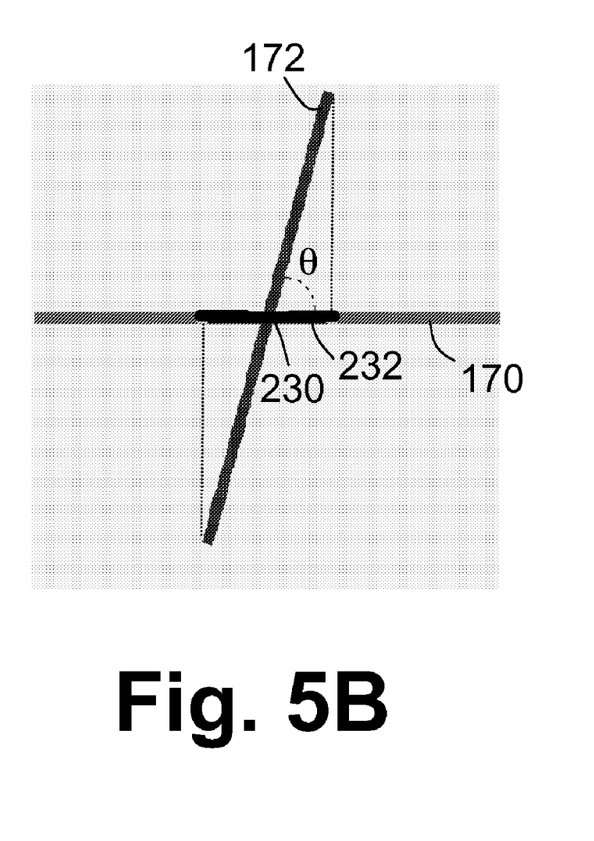

With reference to FIGS. 5A and 5B, the technique can be extended to non-orthogonal slices. FIGS. 5A and 5B illustrate a first slice 170 and a second slice 172 oriented at an angle θ respective to the first slice 170. The imaging of the first slice 170 employs slice selective magnetic field gradients in a direction denoted "ss", phase encoding magnetic field gradients in a direction denoted "pe", and frequency-encoding magnetic field gradients in a direction denoted "rd". Similarly, imaging of the second slice 172 employs slice selective magnetic field gradients in a direction denoted by a primed "ss" (ss'), phase encoding magnetic field gradients in a direction denoted by a primed "pe" (pe'), and frequency-encoding magnetic field gradients in the same "rd" direction as is used for reading out the first slice 170. A relationship between the slice-select and readout directions "ss" and "pe" used for imaging the first slice 170 and the corresponding primed slice-select and readout directions and used for imaging the first slice 172 is suitably given by the rotation matrix:

$$\begin{bmatrix} ss' \\ pe' \end{bmatrix} = \begin{bmatrix} \cos(\theta) & \sin(\theta) \\ -\sin(\theta) & \cos(\theta) \end{bmatrix} \cdot \begin{bmatrix} ss \\ pe \end{bmatrix}. \quad (1)$$

Note that for θ=90° corresponding to the orthogonal case of FIGS. 3A and 3B, the rotation matrix of Equation (1) reduces to swapping the "slice-select" and "phase-encode" directions of FIGS. 3A and 3B. As in the orthogonal case, there is a saturated intersection stripe region 230 (indicated in black in FIGS. 5A and 5B for the first slice 170) where the slices 170, 172 intersect. However, in the case where θ<90°, a region of cross-slice interference 232 (indicated in gray in FIGS. 5A and 5B for the first slice 170) is larger than the saturated intersection stripe region 230. In general, the cross-slice interference region 232 increases in width symmetrically about the intersection stripe region 230 as the angle θ between the slices decreases from 90°. The cross-slice interference region 232 is estimated to have a width of:

$$d_{int} = \cos(\theta) \cdot FOV + \cos(90° - \theta) \cdot d_{slice} \quad (2)$$

where: $d_{int}$ is the width of the cross-slice interference region 232 in the slice 170; FOV is the field of view of the interfering slice 172 (denoted "FOV" in FIG. 5A); and $d_{slice}$ is the slice thickness.

For angles close to 90°, the width of the cross-slice interference region 232 is relatively small. If the portion of the image lying within the cross-slice interference region 232 is relatively unimportant, it may be neglected. For smaller angles and/or for images in which the central region where the slices intersect is of importance, methods like sensitivity encoding (SENSE) can be used to separate the two slices. By using the coils array 34 (see FIG. 1) for data acquisition together with a previously acquired reference scan, typically done in 3 dimensions, the contribution of both slices can be separated. Furthermore, with more processing, the "projected" slice, that is the version of the slice image with coarse resolution that arises from projection onto the second slice image, can be used to increase the signal-to-noise ratio (SNR) of acquisition.

Figure 6A:
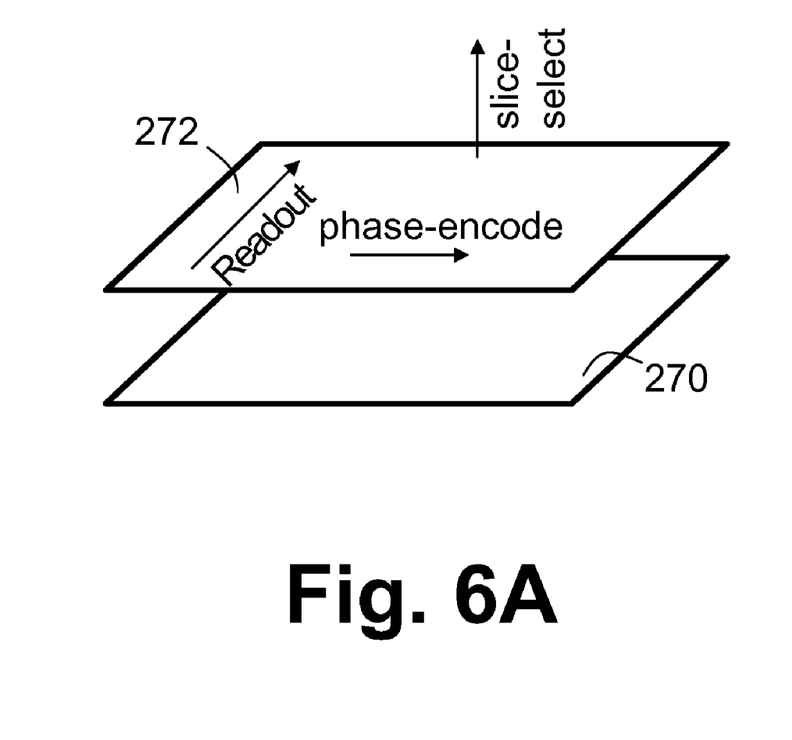
FIGS. 6A and 6B show perspective and side views, respectively, of two parallel slices imaged using coherent multi-slice imaging.
Figure 6B:
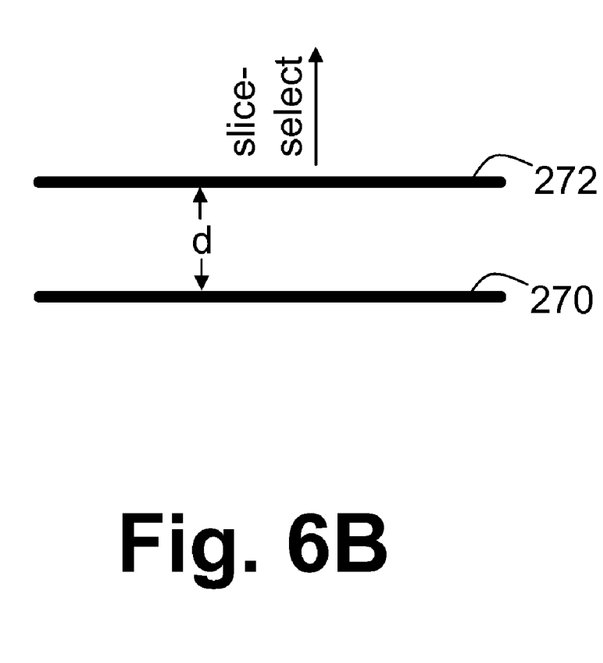

With reference to FIGS. 6A and 6B, the extreme case of parallel slices (θ=0°) is discussed. Specifically, first and second slices 270, 272 are parallel to one another but separated in the "slice-select" direction by a distance "d". In this arrangement, selection of both first and second slices 270, 272 is done using magnetic field gradients in the same "slice-select" direction, with the specific selected one of slices 270, 272 being controlled by the magnitude of the magnetic field gradient and/or the frequency of the radio frequency excitation pulse. Phase encoding of both first and second slices 270, 272 is performed using magnetic field gradients in the same "phase-encode" direction, and frequency encoding of both first and second slices 270, 272 is performed using magnetic field gradients in the same "readout" direction.

Because the slices 270, 272 are parallel, the region of cross-slice interference is large—indeed, using Equation (2) the width $d_{int}$ of the interference region in the slice 270 is equal to the field of view of the interfering slice 272. Thus, if both slices 270, 272 have the same field of view then the interference spans the entire slice.

To address this problem, the coils array 34 (see FIG. 1) is suitably used for the imaging. The coils of the coils array 34 have different coil sensitivities, so that the reconstructed images are sensitivity encoded (SENSE) images having sensitivity encoding in the "slice-select" direction transverse to the spaced-apart parallel slices 270, 272. The sensitivities processor 64 (see FIG. 1) performs SENSE unfolding respective to the slice-select direction to generate reconstructed images corresponding to the plurality of slices 270, 272 with cross-slice interference substantially removed by the SENSE unfolding. Those skilled in the art will appreciate that similar sensitivities processing can be used to remove cross-slice interference in the case of non-orthogonal and non-parallel slices such as the slices 170, 172 shown in FIGS. 5A and 5B.

In the illustrated pulse sequence of FIG. 4 the two slices are imaged using substantially similar pulse sequences, except that the role of gradients in the "slice-select" and "phase-encode" directions is swapped. Similarly, the illustrated multi-slice sets (that is, the slices 70, 72 of FIGS. 2A and 2B; the slices 170, 172 of FIGS. 5A and 5B; or the slices 270, 272 of FIGS. 6A and 6B) are illustrated as being substantially similar except for position and/or orientation. More generally, however, each slice of the multi-slice coherent imaging can be imaged using different imaging parameters such as different numbers of phase-encoding steps, different readout gradients, different slice thicknesses, different fields-of-view (FOV's), different temporal resolutions, and so forth. Indeed, the different slices are optionally imaged using different types of coherent imaging. The prescription for each slice need not be the same in time and in resolution or imaging parameters but in general uses coherent imaging that applies fully balanced gradient waveforms.

In FIG. 4 the interleaved radio frequency excitation pulses are incorporated into corresponding readouts. For example, the excitation pulse 120 and associated magnetic field gradient 124 which maintains the steady spin state of the first slice 70 is incorporated into the readout 80 which reads the first slice 70, and similarly the excitation pulse 122 and associated magnetic field gradient 126 which maintains the steady spin state of the second slice 72 is incorporated into the readout 82 which reads the second slice 72. More generally, however, such correspondence can be omitted. For example, the excitation pulse and associated gradient for exciting the second slice 72 can be incorporated into the readout of the first slice 70 and vice versa. In other arrangements, some or all of the radio frequency excitations that maintain the slices in steady spin states can be grouped together between readouts.

In some readouts, dead times are created in the phase-encoding and slice-selection directions resulting from the shifting of the slice selection gradient to the alternate direction. These dead times are optionally used to apply moment-nulling pulses (for example, for flow compensation or moment cancellation). In typical SSFP sequences, the phase encoding gradients are not nulled with respect to the first moment. By the addition of a bipolar pair of pulses, the residual first moment can be removed in both the phase encoding and slice-select axes. Such moment cancellation is anticipated to lead to better flow performance, and can be used to null through plane flow completely.

Although Cartesian multi-slice coherent imaging is described herein, the approaches are extendible to non-Cartesian imaging. For example, in radial imaging, the readout gradient is spread between both "readout" and "phase encoding gradients." Accordingly, for imaging two slices the pulse sequence has three time-varying magnetic field gradients. Interleaving of volume or three-dimensional acquisitions is similarly supported—however, the cross-slice interference regions become cross-volume interference regions, which are typically thicker, though can still be separated with a SENSE type process.

One application of the imaging plane orientations of FIGS. 5A and 5B is for cardiac imaging. The two slices 170, 172 are suitably selected as a short-axis view and a long-axis view of the heart. As in the orthogonal case, a third slice (not shown) angled with respect to the slices 170, 172 can also be included in the multi-slice coherent imaging sequence to image another long-axis view of the heart. Since the readouts of the slices 170, 172 can be repeated indefinitely as long as the steady spin states of the slices are maintained, temporal evolution or retrospective gated cardiac reconstruction is readily performed. The orthogonal slices of FIGS. 3A and 3B can also be used for certain quantitative cardiac analyses. For example, cardiac function indexes such as ejection fraction, end-systolic volume, end-diastolic volume, and so forth are readily approximated from two orthogonal slices or views. More accurate quantitative cardiac analyses may be possible using more precise non-orthogonal short- and long-axis views as illustrated in FIGS. 5A and 5B. Another application of the disclosed multi-slice coherent imaging is in catheter tip tracking. As two or three orthogonal slices are imaged in a rapid time-multiplexed readout, catheter tip tracking in three dimensional space is facilitated. While cardiac imaging and catheter tip tracking are set forth herein as two suitable applications, those skilled in the art will find many other applications which are enabled, facilitated, improved, or otherwise benefit from the multi-slice coherent imaging techniques disclosed herein.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having described the preferred embodiments, the invention is now claimed to be:

1. A magnetic resonance imaging method comprising:
   performing time domain multiplexed readouts for a plurality of steady spin state slices, each readout acquiring magnetic resonance data corresponding to one of the steady spin state slices, the plurality of slices including first and second orthogonal slices, and the performing of time domain multiplexed readouts including applying a magnetic field gradient in a first direction to phase encode the steady spin state of the first slice and applying a magnetic field gradient in a second direction orthogonal to the first direction to phase encode the steady spin state of the second slice;
   interleaving radio frequency excitation pulses with the time domain multiplexed readouts to maintain the steady spin states of the slices; and
   reconstructing the acquired magnetic resonance data to produce reconstructed images corresponding to the plurality of slices.

2. The magnetic resonance imaging method as set forth in claim 1, wherein the interleaving of radio frequency excitation pulses includes:

applying one or more excitation pulses with a slice select magnetic field gradient in the second direction to maintain the spin state of the first slice; and applying one or more excitation pulses with a slice select magnetic field gradient in the first direction to maintain the spin state of the second slice.

3. The magnetic resonance imaging method as set forth in claim 1, wherein the performing of time domain multiplexed readouts includes:

applying a readout magnetic field gradient in a third direction orthogonal to the first and second directions to frequency encode readouts of the first and second slices.

4. The magnetic resonance imaging method as set forth in claim 1, wherein the plurality of slices include a third slice orthogonal to both the first and second slices, and the performing of time domain multiplexed readouts includes:

applying a magnetic field gradients in the first and second directions during readout of the third slice to perform frequency and phase encoding of the third slice.

5. The magnetic resonance imaging method as set forth in claim 1, wherein each of the time domain multiplexed readouts corresponds to one of: a steady state free precession (SSFP) readout, a fast imaging with steady precession (True-FISP) readout a balanced fast field echo (bFFE) readout, and a completely balanced steady state (CBASS) readout.

6. A magnetic resonance imaging method comprising:

performing time domain multiplexed readouts for a plurality of steady spin state slices including first and second slices having a selected non-zero angle therebetween, each readout acquiring magnetic resonance data corresponding to one of the steady spin state slices, the performing of time domain multiplexed readouts including applying a first magnetic field gradient to phase encode the steady spin state of the first slice and applying a second magnetic field gradient to phase encode the steady spin state of the second slice, an angle between the first and second magnetic field gradients corresponding to the selected angle between the first and second slices;

interleaving radio frequency excitation pulses with the time domain multiplexed readouts to maintain the steady spin states of the slices; and reconstructing the acquired magnetic resonance data to produce reconstructed images corresponding to the plurality of slices.

7. The magnetic resonance imaging method as set forth in claim 6, further including:

preparing a plurality of slices each in a steady spin state;

repeating the performing of time domain multiplexed readouts, the interleaving of radio frequency excitation pulses, and the reconstructing without repeating the preparing to produce a plurality of time separated reconstructed images of each slice.

8. The magnetic resonance imaging method as set forth in claim 6, wherein the interleaving of radio frequency excitation pulses includes:

applying one or more excitation pulses with a slice select magnetic field transverse to the first slice to maintain the spin state of the first slice; and applying one or more excitation pulses with a slice select magnetic field gradient transverse to the second slice to maintain the spin state of the second slice.

9. The magnetic resonance imaging method as set forth in claim 6, wherein the plurality of slices include a third slice having selected angles between the first and second slices, and the performing of time domain multiplexed readouts includes:

applying magnetic field gradients in the first and second directions during readout of the third slice to perform frequency and phase encoding of the third slice.

10. The magnetic resonance imaging method as set forth in claim 6, wherein the performing of time domain multiplexed readouts includes:

applying a first readout magnetic field gradient orthogonal to the first and second magnetic field gradients to frequency encode the first slice; and applying a second readout magnetic field gradient orthogonal to the first and second magnetic field gradients to frequency encode the second slice.

11. The magnetic resonance imaging method as set forth in claim 10, wherein the first and second readout magnetic field gradients are one of parallel and anti parallel.

12. The magnetic resonance imaging method as set forth in claim 6, further including:

disregarding a saturated region of each reconstructed image, the saturated region including at least an intersection of the first and second slices.

13. The magnetic resonance imaging method as set forth in claim 12, wherein the selected angle is less than 90°, a first cross slice interference region in the first slice includes a projection of the second slice onto the first slice, and second cross slice interference region in the second slice includes a projection of the first slice onto the second slice.

14. The magnetic resonance imaging method as set forth in claim 6, wherein the first slice corresponds to a short axis view of a heart and the second slice corresponds to a long axis view of the heart.

15. The magnetic resonance imaging method as set forth in claim 14, wherein the plurality of slices include a third slice having selected angles between the first and second slices, the third slice corresponding to another long axis view of the heart different from the long axis view of the second slice.

16. The magnetic resonance imaging method as set forth in claim 6, wherein the performing of time domain multiplexed readouts employs a plurality of coils having different coil sensitivities, and the reconstructing includes:

reconstructing the magnetic resonance data to produce sensitivity encoded (SENSE) images having sensitivity encoding due to the use of multiple coils in the readout; and performing sensitivity decoding to suppress cross slice interference in the reconstructed slices.

17. The magnetic resonance imaging method as set forth in claim 6, wherein each of the time domain multiplexed readouts corresponds to one of: a steady state free precession (SSFP) readout, a fast imaging with steady precession (True-FISP) readout, a balanced fast field echo (bFFE) readout, and a completely balanced steady state (CBASS) readout.

18. A magnetic resonance imaging system performing the method of claim 6.

19. The magnetic resonance imaging method comprising:

performing time domain multiplexed readouts for a plurality of steady spin state slices including spaced apart parallel slices, each readout acquiring magnetic resonance data corresponding to one of the steady spin state slices, the performing of time domain multiplexed readouts employing a plurality of coils having different coil sensitivities;

interleaving radio frequency excitation pulses with the time domain multiplexed readouts to maintain the steady spin states of the slices;

reconstructing the acquired magnetic resonance data to produce sensitivity encoded (SENSE) images having sensitivity encoding in a slice select direction transverse to the spaced apart parallel slices; and performing SENSE unfolding respective to the slice select direction to generate reconstructed images corresponding to the plurality of slices.

20. The magnetic resonance imaging method as set forth in claim 19, wherein each of the time domain multiplexed readouts corresponds to one of: a steady state free precession (SSFP) readout, a fast imaging with steady precession (True-FISP) readout, a balanced fast field echo (bFFE) readout, and a completely balanced steady state (CBASS) readout.

\* \* \* \* \*